United States Patent [19]

Smith et al.

[11] Patent Number: 4,536,051

[45] Date of Patent: Aug. 20, 1985

[54] ELECTRICAL INTERFACE ARRANGEMENTS

[75] Inventors: John L. Smith; Frank H. Jenner, both of St. Albans, England

[73] Assignee: Marconi Instruments Limited, St. Albans, England

[21] Appl. No.: 435,361

[22] Filed: Oct. 20, 1982

[30] Foreign Application Priority Data

Oct. 21, 1981 [GB] United Kingdom ............... 8131774

[51] Int. Cl.³ ..................... H01R 11/18; G01R 31/02
[52] U.S. Cl. ........................... 339/117 P; 324/73 PC; 324/158 F
[58] Field of Search ......................... 339/117 P, 255 R; 324/73 PC, 158 F, 158 P

[56] References Cited

U.S. PATENT DOCUMENTS 4,108,528 8/1978 Long et al. ..................... 339/117 P
4,427,250 1/1984 Hines et al. .................. 339/117 P X

FOREIGN PATENT DOCUMENTS 1233309 5/1971 United Kingdom .
2038567A 7/1980 United Kingdom .
2056187A 3/1981 United Kingdom .
1594118 7/1981 United Kingdom .

Primary Examiner—Z. R. Bilinsky
Attorney, Agent, or Firm—Spencer & Frank

[57] ABSTRACT

An electrical interface arrangement enables a circuit board to be connected to test equipment for the purpose of verifying its correct operation or enabling malfunctions to be identified. The interface arrangement carries a two dimensional array of electrical contacts which, in operation, are brought into touching contact with predetermined locations of the circuit board. It is necessary to hold the circuit board firmly in contact with the array of contacts in exactly the correct alignment. The invention provides a common housing which serves to locate the circuit board in alignment with the two dimensional array of contacts and either the circuit board can be secured to the housing by means of a suction effect generated by a suction chamber located within the housing, or alternatively the circuit board can be secured by means of an externally located pressure plate.

8 Claims, 1 Drawing Figure

U.S. Patent  Aug. 20, 1985  4,536,051
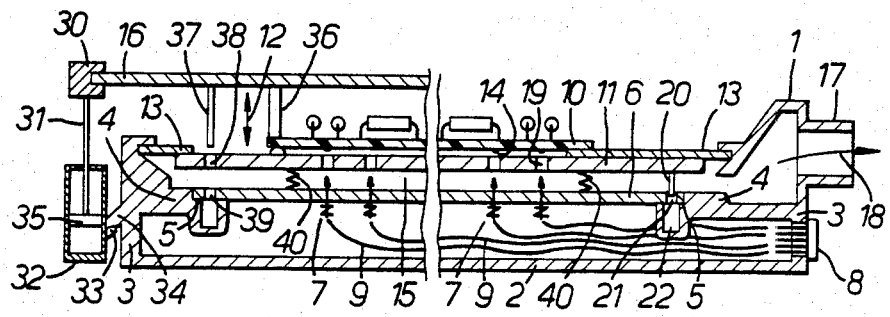

ELECTRICAL INTERFACE ARRANGEMENTS

BACKGROUND OF THE INVENTION

This invention relates to electrical interface arrangements which are suitable for use with apparatus for testing circuits formed as flat boards. It is becoming increasingly common to form electrical circuits, as what are generally termed printed circuit boards, which comprise an insulating lamina with conductive tracks formed on one or both of its outer surfaces. The circuit components, such as resistors, capacitors, transistors, etc., which are electrically interconnected by means of these conductive tracks are generally mounted on only one side of the insulating lamina. Circuit boards of this kind can be very complex indeed and special techniques are needed to thoroughly test them after manufacture to ensure that the interconnections have been correctly made, that the components are not defective, and that the circuit operates correctly in the intended manner.

One of the problems which arises in testing a printed circuit board is that of making electrical connection to predetermined locations of it in a reliable and consistent manner, and it is usually necessary to employ a special electrical interface between the test equipment and the circuit under test. The electrical interface includes a two dimensional array of contact points positioned in a predetermined pattern so that they touch specified locations of the conductive tracks carried by the circuit board. In order that contact is made exactly at the specified locations, the circuit board must be accurately aligned with the array of contacts and held firmly against them. Because circuit boards can be fairly large and the insulating lamina can be fairly thin, they are flexible to a certain extent and, to ensure proper electrical contact, the board must be firmly supported across its surface area.

Various methods of support are available which are suitable for different kinds of circuit boards, and some methods are more suitable than others depending on the nature of the circuit and the kind of access to it which might be needed whilst it is actually being tested. It has been customary to provide an electrical interface arrangement which is capable of providing support in only one predetermined manner and this results in duplication of expensive equipment and can significantly increase manufacturing costs.

The present invention seeks to provide a more versatile electrical interface arrangement in which these difficulties are reduced.

SUMMARY OF THE INVENTION

According to this invention, an electrical interface arrangement for enabling a circuit board under test to be electrically connected to test equipment includes a housing arranged to locate and support a bed plate having a two dimensional array of electrical contacts projecting from one surface of it; a carriage plate mounted in alignment with the bed plate and which is movable towards and away from the bed plate and which is provided with apertures aligned with the electrical contacts so that the contacts project through the carriage plate when it is in a position closely adjacent to the bed plate; the housing being provided with a suction chamber having walls partly defined by the bed plate and the carriage plate so that when a partial vacuum is formed in the chamber the carriage plate and any circuit board carried by it can be drawn into contact with said electrical contacts; the housing also being arranged to be able to receive a pressure plate assembly having a pressure plate aligned with a bed plate and which is operative to act upon the side of a circuit board remote from the carriage plate to force it into contact with said electrical contacts.

Although the electrical interface arrangement can be permanently provided with the pressure plate assembly, this is generally not necessary, since the circuit board will be held in contact with the electrical contacts either under the action of the partial vacuum which is produced within the suction chamber or under the action of the pressure plate, and one or other of these methods can conveniently be chosen before the circuit board is mounted in the electrical interface arrangement. If the circuit board is to be held under partial vacuum in contact with the electrical contacts, it is necessary to impart the partial vacuum to the suction chamber and this can be most easily accomplished by the provision of an external vacuum line, which is connected to the suction chamber in an air tight manner. On the other hand, when the pressure plate assembly is being used to hold the circuit board in contact with the electrical contacts, it is, of course, not necessary that under these conditions the suction chamber shall be air tight, and any gas tight seals associated with the suction chamber can be discarded.

Electrical connection is made between the test equipment and the electrical interface arrangement by a network of wires which are individually connected to the electrical contacts. Generally it is convenient to include an electrical connector, such as plug and socket arrangements, by means of which the electrical interface arrangement can be connected to, and disconnected from, the test equipment at will. In this case, the wires interconnecting the electrical connector to the electrical contacts which are mounted on the bed plate can be extensive and complex. A significant proportion of the cost of manufacturing the electrical interface arrangement can be associated with the provision of this network of wires, and the invention makes it unnecessary to duplicate this facility, since a common housing with its associated wiring can be used whichever method of applying pressure is used to bring the circuit board into contact with the electrical contacts.

BRIEF DESCRIPTION OF THE DRAWINGS

The invention is further described by way of example with reference to the sole FIGURE of the drawing which shows a sectional view of the electrical interface arrangement according to the invention.

DESCRIPTION OF THE PREFERRED EMBODIMENT

Referring to the FIGURE, the electrical interface arrangement comprises a robust housing 1 having a base 2 and four side walls 3 (of which only two walls are visible in the sectional view). A ledge 4 runs around the inside of the walls 3 and is provided with a recess 5 which locates a detachable bed plate 6. The bed plate 6 carries an array of electrical contacts 7, which comprises spring loaded pins which are located in individual cylindrical housings which are securely mounted within small apertures formed through the bed plate. The array of electrical contacts is connected to an interface connector 8 via a network of individual electrically conductive wires 9, which are each enclosed within insulating sleeves to prevent the occurrence of undesirable short circuits. A circuit board 10 under test rests on a carriage plate 11, which is movable towards and away from the bed plate in the direction of the double headed arrow 12. The carriage plate 11 is attached to the walls 3 of the housing 1 by means of a flexible diaphragm 13.

When the board 10 is to be tested, it is placed upon the upper surface of the carriage plate 11. Its exact position upon the carriage plate 11 is of great importance, since the electrical contacts 7 must be aligned with selected locations of conductive tracks 14 carried upon the underside of the circuit board 10. When the circuit board 10 has been correctly positioned upon carriage plate 11, both the board 10 and the carriage plate 11 are lowered towards the bed plate 6 until the spring loaded contacts 7 press firmly against the underside of the board 10. The contacts 7 pass freely through small apertures 19 placed in the carriage plate 11 so as to be aligned therewith.

The circuit board 10 and the carriage plate 11 can be moved either under the action of a partial vaccum formed within a suction chamber 15 of the housing 1, or alternatively it can be moved under the action of an externally provided pressure plate 16. The right hand side of the drawing illustrates the former alternative, whereas the left hand side of the drawing illustrates the latter alternative. Those parts of the drawing already described are common and are provided whichever method of moving the carriage plate 11 is used.

Considering first the right hand side of the drawing, the suction chamber 15 is defined by the bed plate 6, the carriage plate 11 and parts of the wide walls 3 of the housing 1. The flexible diaphragm 11 provides a gas tight seal between the movable carriage plate 11 and the housing 1. The partial vacuum is formed by means of a vacuum line (not shown) attached to a port 17.

It is not necessary to produce a very high vaccum, and any one of a number of convenient means can be used to produce the suction effect. For example, a small extractor pump could be used, or an air pressure line could be used in conjunction with a venturi jet to produce the necessary reduction in pressure. As air is extracted from the suction chamber 15 in the direction of the arrow 18, the carriage plate 11 is drawn downwards towards the bed plate 6. The circuit board 10 is carried with it, and the movement ceases when the electrical contacts 7 are forced against the underside of the circuit board 10. The suction effect holds the circuit board 10 firmly in contact with the carriage plate 11 during the movement and holds the board 10 in contact with the electrical contacts 7 whilst electrical tests and measurements are being performed by test equipment (not shown) connected to it via the connector 8. Retraction of the carriage plate 11 is effected by the return springs 40.

It is essential that throughout the movement, and whilst testing takes place, that the carriage plate 11 is accurately aligned with the bed plate 6, and this is achieved by providing registration pins 20 on the underside of the carriage plate 11. These pass through accurately positioned holes 21 in the bed plate 6, and recesses 22 are provided in the ledge 4 to accommodate them when the carriage plate 11 is in its lowest position. The pins 20 are of sufficient length such that they are at least partially engaged with the holes 21 even when the carriage plate 11 is in its uppermost position.

The use of a suction technique has the great advantage that access is freely available to the upperside of the circuit board 10 but it is satisfactory only if the suction chamber 15 can be made substantially airtight and this is difficult to achieve if the circuit board 10 contains cut-outs or other apertures in its surfaces. Furthermore, if the circuit board 10 is insufficiently flexible, it may be difficult to provide a good seal between it and the diaphragm 13 even though the diaphragm overlaps the carriage plate 11 sufficiently to be squeezed between it and the circuit board 10. Because of these considerations and because it is often desired to ensure a more positive contact with the electrical contacts 7, a pressure plate assembly can be used in conjunction with the housing 1.

This pressure plate assembly is shown in the left hand side of the drawing and it comprises a rigid frame 30 which holds the pressure plate 16 and which is movable in the direction of the arrows 12 by means of a mechanical linkage 31 which is coupled to a pneumatically operated cylinder 32. Any other convenient form of mechanical actuator could be used. A part 33 of the cylinder 32 co-operates with a projecting rim 34 attached to the walls 3 of the housing 1 so that as the piston 35 within the cylinder 32 is forced downwards, the pressure plate 16 is carried with it. The pressure plate 16 carries rigid prongs 36 which are positioned at predetermined locations so that they bear upon the upper surface of the circuit board and force it into contact with the array of test pins 7. These prongs 36 can be distributed across the whole of the surface of the circuit board 10, so as to securely support it.

The pressure plate 16 is held within grooves formed in the frame 30 so that it can be easily withdrawn when the pressure plate assembly is released. Each type or kind of circuit board 10 has its own associated pressure plate 16 carrying prongs 36 in positions which are generally unique to that circuit board. Thus the appropriate pressure plate 16 can be selected and inserted into the frame 30 when a particular circuit board is to be tested. This can readily be achieved by permitting the frame 30 to pivot relative to the housing—this facilitates both the insertion and removal of the circuit boards 10 as well as the pressure plates 16.

It is necessary to align the pressure plate 16 with the bed plate 6 as well as with the carriage plate 11. Registration pins 37 are attached to the underside of the pressure plate 16, and these align with holes 38 in the carriage plate 11 and with holes 39 in the bed plate 6. These holes 39 will generally be provided in addition to some pins 20 mounted on the carriage plate 11 which serve to maintain alignment between the bed plate 6 and the carriage plate 11 even when the pressure plate 16 is removed. When the carriage plate 11 is to be used in the suction mode of operation, the holes 38 can be used to mount pins such as registration pins 20. Alternatively a substitute carriage plate 11 can be used instead.

We claim:

1. An electrical interface arrangement for enabling a circuit board under test to be electrically connected to test equipment including a housing arranged to locate and support a bed plate having a two dimensional array of electrical contacts projecting from one surface of it; a carriage plate mounted in alignment with the bed plate and which is movable towards and away from the bed plate and which is provided with apertures aligned with the electrical contacts so that the contacts project through the carriage plate when it is in a position closely adjacent to the bed plate; the housing being provided with a suction chamber having walls partly defined by the bed plate and the carriage plate so that when a partial vacuum is formed in the chamber the carriage plate and any circuit board carried by it can be drawn into contact with said electrical contacts; the housing also being adapted to receive and cooperate with a pressure plate assembly having a pressure plate aligned with a bed plate and which is operative to act upon the side of a circuit board remote from the carriage plate to force it into contact with said electrical contacts independently of the existence of a partial vacuum in said chamber.

2. An arrangement as claimed in claim 1 and wherein means external to the housing are provided to engage with an actuator which is operative upon said pressure plate.

3. An arrangement as claimed in claim 2 and wherein the pressure plate assembly includes means enabling the pressure plate to be interchanged in dependence on the nature of the circuit board being tested.

4. An arrangement as claimed in claim 1, and wherein the bed plate is arranged to accept interchangeable carriage plates in alignment therewith in dependence on whether the carriage plate is movable under the action of the suction chamber or under the action of the pressure plate.

5. An electrical interface arrangement for enabling a circuit board under test to be electrically connected to test equipment; said arrangement comprising: a housing; a bed plate located and supported in said housing, said bed plate having a two dimensional array of electrical contacts projecting from one surface of said bed plate; a carriage plate mounted in alignment with said bed plate and which is movable towards and away from said bed plate and which is provided with apertures aligned with the electrical contacts so that the contacts project through said carriage plate when said carriage plate is in a position closely adjacent to said bed plate; said housing being provided with a suction chamber having walls partly defined by said bed plate and said carriage plate so that when a partial vacuum is formed in said chamber said carriage plate and any circuit board carried by said carriage plate can be drawn into contact with said electrical contacts; said arrangement further comprising a pressure plate assembly detachably mountable on said housing and said housing comprising means for receiving said pressure plate assembly, said pressure plate assembly comprising a pressure plate operative, when said pressure plate assembly is mounted on said housing, to act upon the side of a circuit board remote from said carriage plate to force it into contact with said electrical contacts independently of the existence of a partial vacuum in said chamber.

6. An arrangement as claimed in claim 5 and wherein means external to the housing are provided to engage with an actuator which is operative upon said pressure plate.

7. An arrangement as claimed in claim 6 and wherein said pressure plate assembly includes means enabling said pressure plate to be interchanged in dependence on the nature of the circuit board being tested.

8. An arrangement as claimed in claim 5, and wherein said bed plate is arranged to accept interchangeable carriage plates in alignment therewith in dependence on whether the carriage plate is movable under the action of the suction chamber or under the action of the pressure plate.

* * * * *